(12) United States Patent
Huang et al.

(10) Patent No.: US 12,392,390 B2
(45) Date of Patent: Aug. 19, 2025

(54) APPARATUS AND METHOD FOR VIBRATION ATTENUATION

(71) Applicant: ASMPT Singapore Pte. Ltd., Singapore (SG)

(72) Inventors: Jinchun Huang, Hong Kong (CN); Zhenyong Bai, Hong Kong (CN); Huawei Guan, Hong Kong (CN); Ping Kong Choy, Singapore (SG); Ka Shing Kwan, Singapore (SG)

(73) Assignee: ASMPT SINGAPORE PTE. LTD., Singapore (SG)

( * ) Notice: Subject to any disclaimer, the term of this patent is extended or adjusted under 35 U.S.C. 154(b) by 35 days.

(21) Appl. No.: 18/505,686

(22) Filed: Nov. 9, 2023

(65) Prior Publication Data

US 2025/0155000 A1     May 15, 2025

(51) Int. Cl.
*F16F 15/00*    (2006.01)
*F16F 15/02*    (2006.01)
*F16M 5/00*     (2006.01)

(52) U.S. Cl.
CPC ............ *F16F 15/002* (2013.01); *F16F 15/02* (2013.01); *F16M 5/00* (2013.01); *F16F 2230/0047* (2013.01); *F16F 2230/18* (2013.01)

(58) Field of Classification Search
None
See application file for complete search history.

(56) References Cited

U.S. PATENT DOCUMENTS

| | | | | |
|---|---|---|---|---|
| 3,212,745 A | * | 10/1965 | Lode | F16F 15/02 52/167.6 |
| 2012/0045723 A1 | * | 2/2012 | Nawata | G03F 7/709 248/550 |
| 2013/0328253 A1 | * | 12/2013 | Kraner | F16F 15/022 267/140.14 |
| 2016/0097436 A1 | * | 4/2016 | Goold | F16F 15/007 267/140.14 |
| 2021/0080348 A1 | * | 3/2021 | Moutafis | G01B 11/24 |
| 2024/0217292 A1 | * | 7/2024 | Waerstad | B60R 16/033 |

FOREIGN PATENT DOCUMENTS

| WO | WO-2017160999 A1 | * | 9/2017 | ............ F16F 15/002 |
|---|---|---|---|---|
| WO | WO-2019035882 A1 | * | 2/2019 | ............ F16F 15/002 |

\* cited by examiner

*Primary Examiner* — Steven M Marsh
(74) *Attorney, Agent, or Firm* — OSTROLENK FABER LLP (57) ABSTRACT

An apparatus for attenuating vibration of a support structure for supporting a movable module that is drivable to move on the support structure. The support structure is isolated from a base by a resilient vibration isolator. The apparatus includes a force compensation system coupled to the support structure for applying one or more first vibration suppression forces on the support structure for at least partially canceling a reaction force exerted by the movable module when the movable module is driven to move on the support structure, and a sensing system attached to the support structure for measuring a vibration parameter of the support structure, wherein the force compensation system is further configured to apply at least one second vibration suppression force on the support structure according to the measured vibration parameter for attenuating vibration of the support structure.

17 Claims, 4 Drawing Sheets

APPARATUS AND METHOD FOR VIBRATION ATTENUATION

FIELD OF THE INVENTION

The invention generally relates to active vibration attenuation in a machine, and more specifically to apparatus and method for attenuating vibration of a support structure on which one or more movable modules are drivable to move. The support structure may be a machine casting or mount frame of a machine for fabricating semiconductor devices, for instance, a machine casting of a bonding machine for semiconductor devices.

BACKGROUND

Machines for fabricating semiconductor devices require both high precision and high production rate. To ensure high precision, transmission of vibration to a machine casting (or support structure) of the machine on which at least one movable module is mounted needs to be minimized. However, as higher throughput requires fast motion of the movable modules together with significant actuating forces, the consequent reaction forces that act on the machine casting may cause severe vibrations in the machine casting. These vibrations can negatively impair the motion performance of the movable modules. The vibrations of the machine casting and the movable modules become severe when the machine casting is supported by soft or resilient isolators. Various measures have been taken to mitigate the adverse effects of the reaction forces that act on the machine casting, such as balance mass and metrology or force frames.

However, the prior art solutions cannot effectively compensate for the reaction forces caused by acceleration of the movable modules due to real-time changes in the acceleration and the center of gravity of the movable modules during their movement on the support structure. Especially when multiple moveable stages are driven to move along different directions on the support structure, no conventional solution is currently available to effectively compensate for the reaction forces caused by the acceleration of the movable modules and to avoid transmission of vibration from a base or floor, in order to effectively attenuate vibration in the support structure.

It would therefore be beneficial to provide a new solution for effectively attenuating the vibration of the support structure of a machine on which at least one movable module is being accelerated, thereby improving the precision and performance of the machine.

SUMMARY OF THE INVENTION

It is thus an object of the invention to seek to provide a more effective apparatus and method for attenuating vibration of a support structure of a machine on which at least one movable module is drivable to move during manufacturing or testing processes. The machine may include equipment for the bonding of semiconductor dies or chips, e.g., thermal compression bonding (TCB), hybrid die bonding, wafer to wafer bonding, die to wafer bonding or other types of bonding.

According to a first aspect of the present invention, there is provided an apparatus for attenuating vibration of a support structure for supporting a movable module that is drivable to move on the support structure. The support structure is isolated from a base by a resilient vibration isolator. The base may be a floor or a lower chassis. The apparatus includes a force compensation system coupled to the support structure for applying one or more first vibration suppression forces on the support structure for at least partially canceling a reaction force exerted by the movable module when the movable module is driven to move on the support structure, and a sensing system attached to the support structure for measuring a vibration parameter of the support structure, wherein the force compensation system is further configured to apply at least one second vibration suppression force on the support structure according to the detected vibration parameter.

With this apparatus, a closed-loop compensation for reaction forces is provided. The force compensation system is configured to provide both feedforward vibration control and feedback vibration control. Specifically, the force compensation system is not only operative to apply one or more first vibration suppression forces on the support structure to compensate for the reaction force caused by acceleration of the movable module, but also used to apply at least one second vibration suppression force on the support structure according to the vibration parameter of the support structure measured by the sensing system so as to effectively resist vibration of the support structure. In other words, the apparatus incorporates both an active force compensation and an active damping system, which work together to effectively counteract reaction forces, thereby achieving optimal machine performance with vibration suppression.

According to embodiments of the invention, the force compensation system includes at least two actuators configured and operative to compensate for a reaction force caused by the movable module which is drivable to move along a linear motion direction. Each actuator is operative to apply a first vibration suppression force parallel to the linear motion direction on the support structure for at least partially canceling the reaction force exerted by the movable module. In certain embodiments, each actuator may be configured and operative such that the reaction force can be substantially canceled without creating unbalanced torque on the support structure.

In certain embodiments, the force compensation system may include four or two pairs of actuators configured to apply a plurality of first vibration suppression forces parallel to the linear motion direction of the movable module so as to balance the plurality of first vibration suppression forces applied onto the support structure. That is to say, the application of the first vibration suppression forces will avoid creating unbalanced torques on the support structure. The center of gravity of the movable module may fall within a space formed between locations of the two pairs of actuators.

In certain embodiments, the force compensation system may include a first set of four actuators configured and operative for compensating for a first reaction force caused by the movable module when the movable module is driven to move in a first motion direction, e.g., the x-axis direction. The first set of four actuators are operative to apply a plurality of first vibration suppression forces parallel to the first motion direction for at least partially canceling the first reaction force so as to balance the plurality of first vibration suppression forces acted on the support structure without creating any unbalanced torques thereon.

The force compensation system may further include a second set of four actuators configured and operative for compensating for a second reaction force caused by the movable module when the movable module is driven to move in a second motion direction, e.g., the y-axis direction.

The second set of four actuators are operative to apply a plurality of first vibration suppression forces parallel to the second motion direction for at least partially canceling the second reaction force so as to balance the plurality of first vibration suppression forces acted on the support structure without creating any unbalanced torques thereon. The first and second motion directions are perpendicular to each other.

To compensate for a third reaction force caused by the movable module when the movable module is driven to move in a third motion direction, e.g., the z-axis direction, the force compensation system may further include a third set of four actuators which are operative to apply a plurality of first vibration suppression forces parallel to the third motion direction on the support structure for at least partially canceling the third reaction force so as to balance the plurality of first vibration suppression forces acted on the support structure without creating any unbalanced torques thereon. The first, second and third motion directions are orthogonal to one another.

In a first embodiment, the support structure has a cuboidal structure. The first set of four actuators may be respectively located near four corners of a first side face or a second side face of opposing side surfaces of the support structure. The first and second opposing side faces are perpendicular to the first motion direction. This helps to maximize the area where compensable reaction forces, resulting from the acceleration of the movable module in the first motion direction, can be effectively accommodated.

The second set of four actuators may be respectively located near four corners of a third side face or a fourth side face of opposing side surfaces of the support structure. The third and fourth side faces are perpendicular to the second motion direction. This helps to maximize the area where compensable reaction forces, resulting from the acceleration of the movable module in the second motion direction, can be effectively accommodated.

The third set of four actuators may be respectively located near four corners of a bottom face of the support structure. This helps to maximize the area where compensable reaction forces, resulting from the acceleration of the movable module in the third motion direction, can be effectively accommodated.

In certain embodiments, the force compensation system may only include one pair of actuators for compensating for a reaction force caused by the acceleration of the movable module in each of the first and second linear motion directions. The first and second linear motion directions are perpendicular to each other. As there may be unbalanced torques caused by the first vibration suppression forces applied by the two actuators, the force compensation system may include four actuators for compensating for a reaction force caused by the acceleration of the movable module in the third motion direction and for canceling the unbalanced torques caused by the plurality of first vibration suppression forces applied onto the support structure. Specifically, each of the four actuators is configured and operative to apply a first vibration suppression force parallel to the third motion direction for at least partially canceling a reaction force caused by acceleration of the movable module in the third motion direction and balancing the plurality of first vibration suppression forces acted on the support structure. The first, second and third motion directions may be the x, y and z axes of an orthogonal cartesian coordinate system.

In a second embodiment, the force compensation system may include a first pair of actuators that are located on a side face of the support structure, which is perpendicular to the first motion direction and a second pair of actuators which are located on a side surface of the support structure perpendicular to the second motion direction and two pairs of actuators which are located on a bottom face of the support structure perpendicular to the third motion direction.

To accurately determine the first vibration suppression forces to be applied by the actuators, the apparatus further includes a processor configured for calculating the one or more first vibration suppression forces based on an acceleration and a position of a center of gravity of the movable module during motion thereof. During the movement of the movable module on the support structure, the required first vibration suppression force(s) are calculated and updated accordingly.

In certain embodiments, the first vibration suppression force system may be mounted on a frame arranged externally coupled to the support structure. Specifically, each actuator of the first vibration suppression force system may be installed on the frame so as to apply a first vibration suppression force on the support structure.

In certain embodiments, the sensing system includes a plurality of sensors mounted on the support structure. Each sensor is located near an actuator of the force compensation system for measuring the vibration parameter of the support structure. Each sensor may include a geophone or an accelerometer. The vibration parameter measured by the sensor may include a velocity and/or an acceleration of the support structure.

According to a second aspect of the present invention, there is provided a semiconductor bonding machine. The semiconductor bonding machine includes an apparatus for attenuating vibration of a support structure in the semiconductor bonding machine. The support structure is used for supporting a plurality of movable modules that are drivable to move on the support structure. For instance, a machine casting in a die bonding machine is used to support both a movable bond stage and a movable bond head during a bonding process. The apparatus includes a force compensation system coupled to the support structure for applying one or more first vibration suppression forces on the support structure for at least partially canceling a reaction force exerted by each of the plurality of movable modules when the plurality of movable modules are driven to move on the support structure during a semiconductor bonding process, and a sensing system attached to the support structure for measuring a vibration parameter of the support structure, wherein the force compensation system is further configured to apply at least one second vibration suppression force on the support structure for resisting vibration of the support structure according to the measured vibration parameter.

According to a third aspect of the present invention, there is provided a method for attenuating vibration of a support structure that supports a movable module that is drivable to move thereon. The method includes activating a force compensation system to apply one or more first vibration suppression forces on the support structure for at least partially canceling a reaction force exerted by the movable module, and applying at least one second vibration suppression force on the support structure with the force compensation system according to a vibration parameter of the support structure measured with a sensing system for attenuating vibration of the support structure.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION OF THE PREFERRED EMBODIMENTS OF THE INVENTION

Figure 1A:
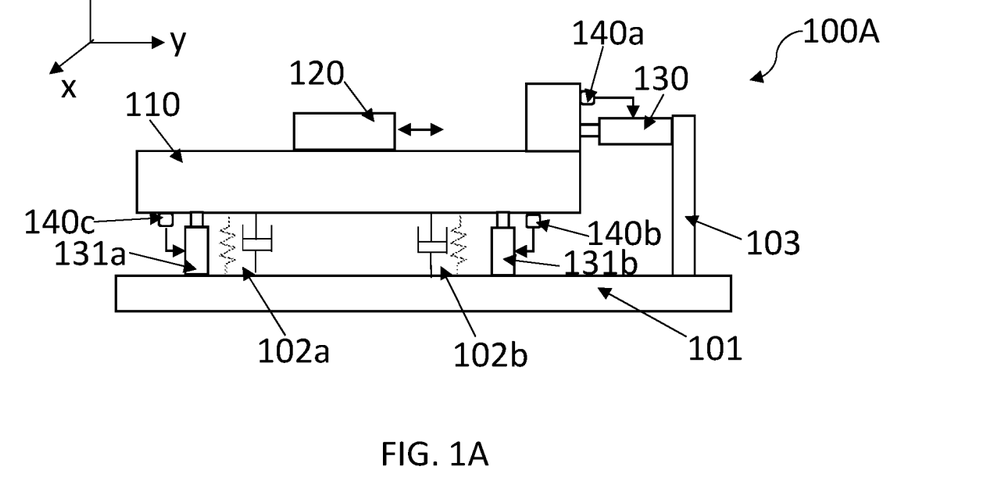
FIG. 1A shows a schematic side view of an apparatus for attenuating vibration of a support structure when driving a movable module to move on the support structure according to a first embodiment of the invention.

FIG. 1A shows a schematic side view of an apparatus 100A for attenuating vibration of a support structure 110 when driving a movable module 120 to move on the support structure 110 according to a first embodiment of the invention. As shown in FIG. 1A, the support structure 110 is isolated from a base 101 by two isolation members 102a and 102b. Each isolation member 102a, 102b may include a resilient isolator, e.g., a spring, and a passive isolator. Alternatively, the support structure 110 may be isolated from the base 101 by more than two isolation members. The base 101 may be a production floor on which the support structure 110 is installed, or a lower chassis which may be isolated by additional isolation members from the floor.

The apparatus 100A includes a force compensation system for providing feedforward vibration control of the support structure 110 when the movable module 120 is driven to accelerate on the support structure 110 and a sensing system attached to the support structure 110 for measuring a vibration parameter of the support structure 110 so that the force compensation system can be also used for providing vibration control based on feedback from the measured vibration parameter. The force compensation system may include a plurality of actuators, such as voice coil motors, coupled to the support structure 110.

Specifically, operation of the feedforward vibration control may include applying one or more first vibration suppression forces on the support structure 110 for at least partially compensating for a reaction force exerted by the movable module 120 when the movable module 120 is driven to move on the support structure 110. The feedback vibration control may include applying one or more second vibration suppression forces on the support structure 110 with the force compensation system to further actively attenuate the vibration of the support structure 110 caused by the acceleration of the movable module 120 based on the measured vibration parameter of the support structure 110.

Specifically, the at least one second vibration suppression force may be calculated based on a velocity of the support structure 110 directly measured by the sensing system or calculated based on an acceleration of the support structure 110 measured by the sensing system.

In use, the force compensation system may be used to apply the one or more first vibration suppression forces, and the at least one second vibration suppression force, on the support structure simultaneously so as to effectively compensate for the reaction force(s) caused by the movement of the moveable module(s) and suppress vibration transmitted from the base 101. Specifically, at time t, the one or first vibration suppression forces are calculated based on an acceleration, and the center of gravity of the movable structure 120 at this moment, accordingly, at least one second vibration suppression force is calculated based on a velocity of the support structure 110 at time t measured by the sensing system or calculated based on an acceleration of the support structure 110 measured by the sensing system.

In the first embodiment, the movable module 120 is driven to move on the support structure 110 along a linear motion direction parallel to the y-axis of a three-dimensional Cartesian orthogonal coordinate system (x, y, z) as shown in FIG. 1A. Accordingly, the force compensation system may include a first actuator 130 configured to apply a first vibration suppression force on the support structure 110 to compensate for a reaction force caused by the acceleration of the movable module 120 along the linear motion direction. As shown in FIG. 1A, the force compensation system further includes a second actuator 131a and a third actuator 131b which are coupled to the support structure 110 for applying one or more second vibration suppression forces to further attenuate the vibration of the support structure 110. The sensing system may include at least one sensor for detecting the vibration parameter of the support structure 110. In this embodiment, the sensing system includes sensors 140a, 140b and 140c which are respectively located adjacent to the actuators 130, 131a and 131b. Each of the sensors 140a, 140b and 140c may be used to detect at least one of velocity, acceleration and displacement of the support structure 110. The detected parameters are used to determine the appropriate second vibration suppression force(s) to be applied onto the support structure 110 by the actuators 130, 131a and 131b.

The first vibration suppression force may be determined based on an acceleration of the movable module 120 and a position of a center of gravity of the movable module 120. The acceleration and the position of the center of gravity of the movable module 120 may be calculated based on a predetermined path of its position over time. The magnitude of the first vibration suppression force is determinable by multiplying the mass of the movable module 120 by the acceleration of the movable module 120.

Figure 1B:
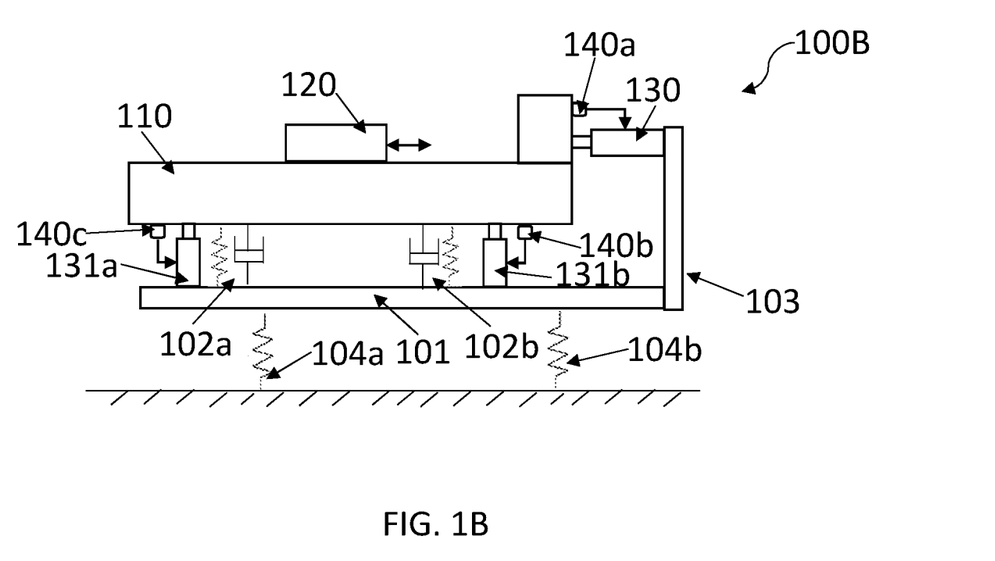
FIG. 1B shows a schematic side view of an apparatus for attenuating vibration of the support structure when driving a movable module to move thereon according to a second embodiment of the invention.

FIG. 1B shows a schematic side view of an apparatus 100B for attenuating vibration of the support structure 110 when driving the movable module 120 to move thereon according to a second embodiment of the invention. The main difference between the second embodiment and the first embodiment is that the base 101 is a lower chassis that is supported by two resilient isolators 104*a* and 104*b* which are installed on the floor. In this embodiment, the actuator 130 is operative to apply a first vibration suppression force on the support structure 110 for at least partially cancelling a reaction force exerted by the movable module 120, and to apply one or more second vibration suppression forces with one or more of the actuators 130, 131*a* and 131*b* on the support structure 110 for further attenuating the vibration of the support structure 110. Each second vibration suppression force may be calculated based on a velocity of the support structure 110 measured by one of the sensors 140*a*, 140*b*, and 140*c*.

Figure 1C:
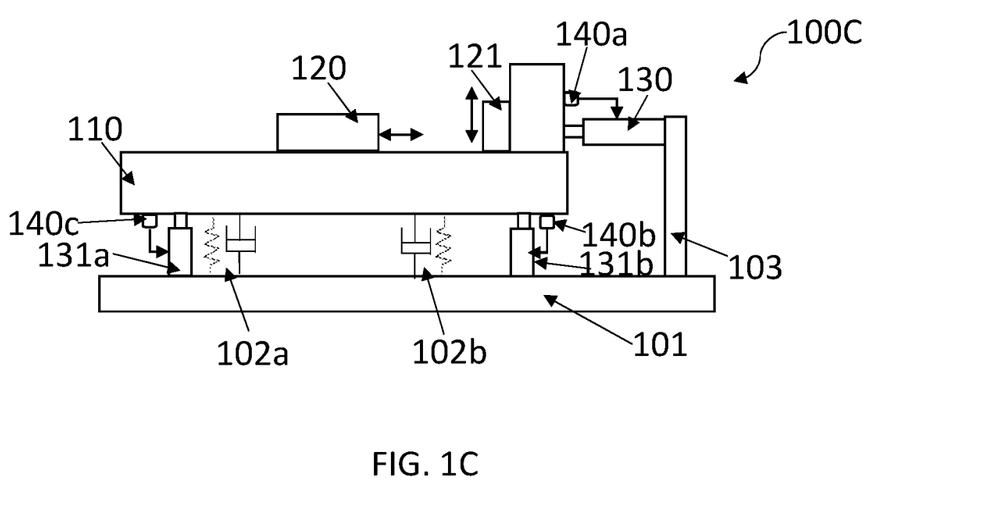
FIG. 1C shows a schematic side view of an apparatus for attenuating vibration of the support structure when driving a plurality of movable modules to move thereon according to a third embodiment of the invention.

FIG. 1C shows a schematic side view of an apparatus 100C for attenuating vibration of the support structure 110 when driving movable modules 120 and 121 to move thereon according to a third embodiment of the invention. In this embodiment, besides the movable module 120, another moveable structure 121 is driven to move along a linear motion direction parallel to the z-axis on the support structure 110. Accordingly, the force compensation system is operative to apply one first vibration suppression force with the first actuator 130 on the support structure 110 for compensating for the reaction force caused by acceleration of the movable module 120 along the linear motion direction parallel to the y-axis, and to apply a further two first vibration suppression forces with the second and third actuators 131*a*, 131*b* on the support structure 110 for compensating for the reaction force caused by the acceleration of the movable module 121 along the linear motion direction parallel to the z-axis. Similar to the first and second embodiments, the three actuators 130, 131*a* and 131*b* are also operative to apply one or more second vibration suppression forces for attenuating the vibration of the support structure 110 based on the vibration parameter of the support structure 110 measured by the sensors 140*a*, 140*c* and 140*b*.

Although in the first to the third embodiments shown in FIG. 1A to FIG. 1C, the force compensation system includes one actuator 130 for compensating for the reaction force caused by the acceleration of the movable module 120, and two actuators 131*a*, 131*b* for compensating for the reaction force caused by the acceleration of the movable structure 121, it should be appreciated that this is only for illustrative purposes. In other embodiments of the invention, to effectively compensate for the reaction force caused by any movable structure on the support structure 110, the force compensation system may include at least two actuators in order to compensate for a reaction force caused by a movable module when it is driven to move in a linear motion direction. Each actuator is operable to apply a first vibration suppression force parallel to the linear motion direction on the support structure 110. In one preferred embodiment, the force compensation system includes four actuators configured to compensate for a reaction force caused by any movable structure which is drivable to move in a linear motion direction on the support structure 110.

Figure 2A:
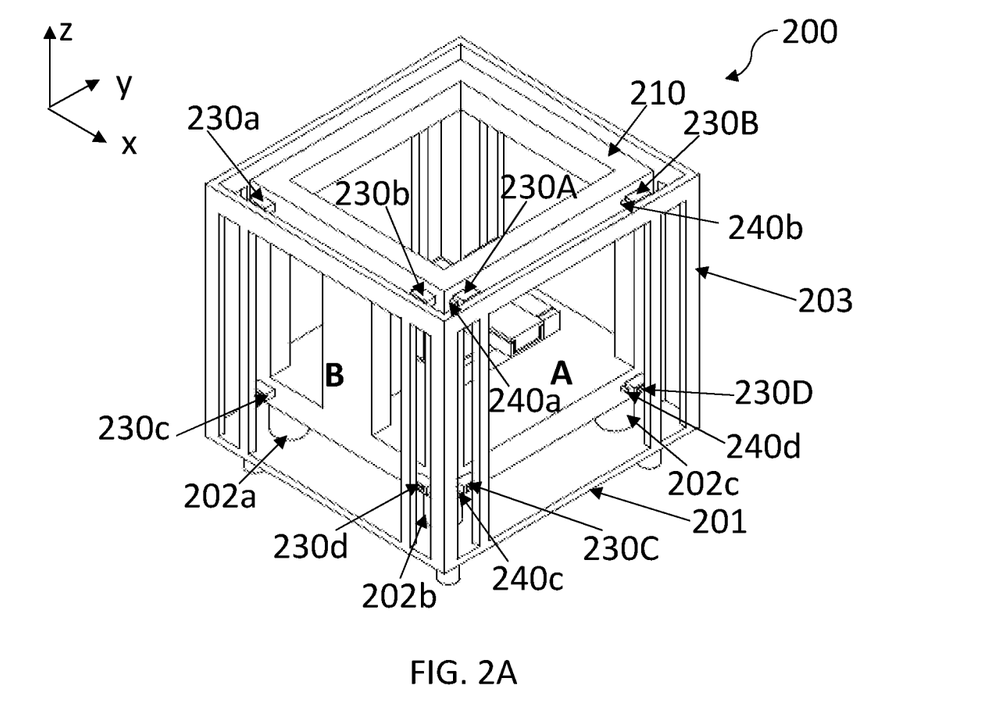
FIG. 2A shows a perspective view of an apparatus for attenuating vibration of a support structure when driving a plurality of movable modules to move on the support structure according to a fourth embodiment of the invention.
Figure 2B:
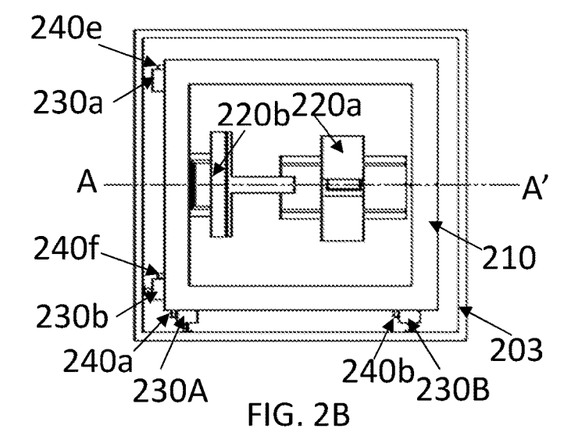
FIG. 2B is a top view of the apparatus shown in FIG. 2A.

FIG. 2A shows a perspective view of an apparatus 200 for attenuating vibration of a support structure 210 when driving a plurality of movable modules to move on the support structure 210 according to a fourth embodiment of the invention. In this embodiment, the support structure 210 is a three-dimensional frame on which a plurality of movable modules may be driven to move along the x-axis, y-axis and/or z-axis.

Referring to FIG. 2A to FIG. 2E, the apparatus 200 includes a force compensation system and a sensing system. The force compensation system includes a number of actuators, such as 12 actuators 230A-D, 230*a-d*, and 231*a-d* which are installed on a base 201 and an outer frame 203 and coupled to the support structure 210 to apply a plurality of first vibration suppression forces and second vibration suppression forces for limiting the vibration of the support structure 210. The sensing system may correspondingly include 12 sensors 240*a*, 240*b*, 240*c*, 240*d*, 240*e*, 240*f*, 240*g*, 240*h*, 240*i*, 240*j*, 240*k*, 240*l* which are installed on the support structure 210, and each sensor is located adjacent to one of the 12 actuators of the force compensation system.

Referring to FIG. 2A, the force compensation system includes four actuators 230A, 230B, 230C and 230D which are installed near four corners on one side surface A of the support structure 210. Each of the four actuators 230A, 230B, 230C and 230D is operable to apply a first vibration suppression force parallel to the x-axis on the support structure 210 for at least partially compensating for a reaction force exerted by a movable module when the movable module is driven to move along a linear motion direction parallel to the x-axis on the support structure 210. The four actuators 230A, 230B, 230C and 230D are arranged such that the first vibration suppression forces applied on the support structure 210 by the actuators 230A, 230B, 230C and 230D are balanced while avoiding any unbalanced torques on the support structure 210.

Referring again to FIG. 2A, the force compensation system also includes four actuators 230*a*, 230*b*, 230*c* and 230*d*, which are installed near four corners of another side surface B of the support structure 210. Each of the four actuators 230*a*, 230*b*, 230*c* and 230*d* is operable to apply a first vibration suppression force on the support structure 210 parallel to the y-axis for at least partially canceling a reaction force exerted by a movable module when the movable module is driven to move along a linear motion direction parallel to the y-axis on the support structure 210. The four actuators 230*a*, 230*b*, 230*c* and 230*d* are arranged such that the first vibration suppression forces applied on the support structure 210 by the actuators 230*a*, 230*b*, 230*c* and 230*d* are balanced while avoiding any unbalanced torques on the support structure 210.

Figure 2C:
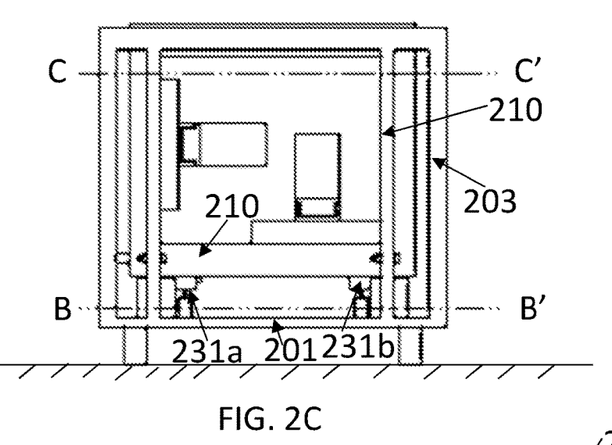
FIG. 2C is a cross-sectional view of the apparatus along line AA' shown in FIG. 2B.
Figure 2D:
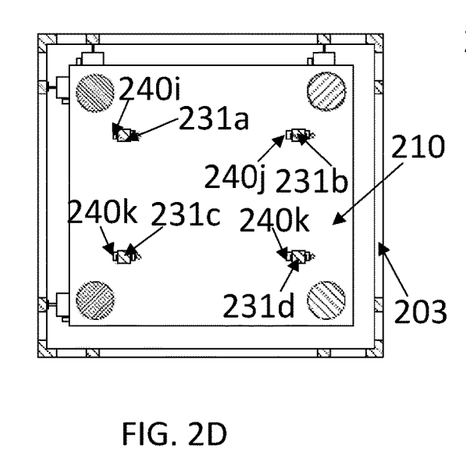
FIG. 2D is a cross-sectional view of the apparatus along line BB' shown in FIG. 2C.
Figure 2E:
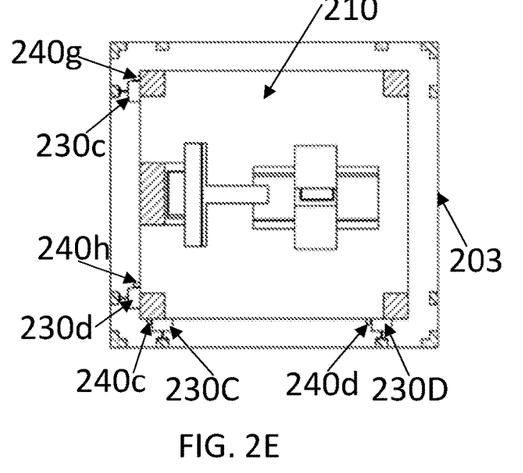
FIG. 2E is a cross-sectional view of the apparatus along line CC' shown in FIG. 2C.

Referring to FIG. 2C and FIG. 2D, the force compensation system further includes four actuators 231*a*, 231*b*, 231*c* and 231*d*, which are installed on the base 201 and coupled to a bottom surface of the support structure 210. Each of the four actuators 231*a*, 231*b*, 231*c* and 231*d* is operable to apply a first vibration suppression force parallel to the z-axis on the support structure 210 for at least partially cancelling a reaction force exerted on the support structure 210 by a movable module 120 when the movable module 120 is driven to move along a linear motion direction parallel to the z-axis on the support structure 210. The four actuators 231*a*, 231*b*, 231*c* and 231*d* are arranged such that the first vibration suppression forces applied on the support structure 210 by the actuators 231*a*, 231*b*, 231*c* and 231*d* are balanced while avoiding any unbalanced torques on the support structure 210.

The 12 sensors of the sensing system are operative to measure the vibration generated in the support structure 210. Each of the 12 sensors may be configured to measure velocity, acceleration and/or displacement of the support structure 210. The velocity, acceleration and/or displacement detected by the 12 sensors will be respectively used for determining the second vibration suppression forces to be applied by the 12 actuators.

With the above arrangement, reaction forces caused by any movable modules which are installed on the support structure 210 and have a center of gravity located within a space formed between the locations of the 12 actuators can be at least partially canceled by one or more first vibration suppression forces applied by one or more of the 12 actuators. Any residual vibrations caused by the acceleration of a movable module can be effectively attenuated by applying one or more second vibration suppression forces on the support structure 210 with the force compensation system according to the measured vibration parameter of the support structure 210. Specifically, each second vibration suppression force may be calculated based on a velocity of the support structure 210 measured by one of the 12 sensors.

Referring to FIG. 3A to FIG. 3D, the main difference between this embodiment and the fourth embodiment shown in FIG. 2A to FIG. 2E is that the force compensation system only includes two actuators for applying first vibration suppression forces in response to a reaction force caused by the acceleration of a movable module along a linear motion direction parallel to the x-axis or y-axis. Specifically, actuators 330A, 330B are arranged to apply a plurality of first vibration suppression forces for at least partially canceling the reaction force caused by a moveable module when it is driven to move along a linear motion direction parallel to the x-axis, and actuators 330a, 330b are arranged to apply a plurality of first vibration suppression forces for at least partially compensating for the reaction force caused by a movable module when it is driven to move along a linear motion direction parallel to the y-axis. The benefit of this arrangement is that the number of actuators used for attenuating the vibration of support structure 310 is reduced.

Figure 3A:
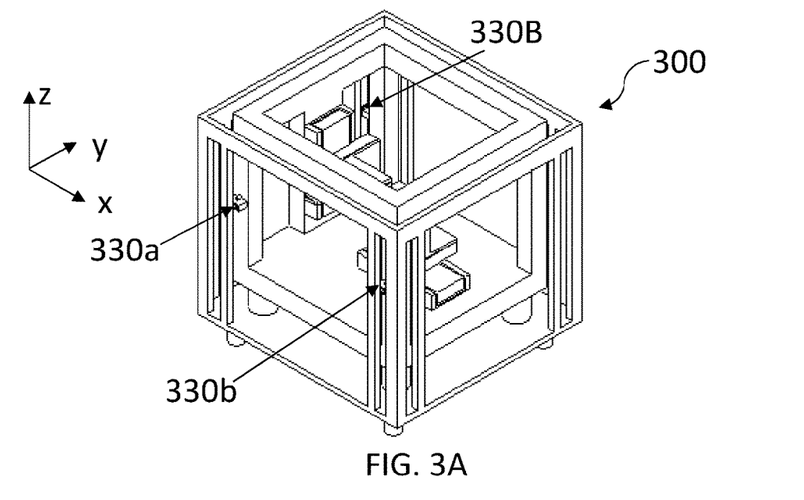
FIG. 3A shows a perspective view of an apparatus for attenuating vibration of a support structure when driving a plurality of movable modules to move on the support structure according to a fifth embodiment of the invention.
Figure 3B:
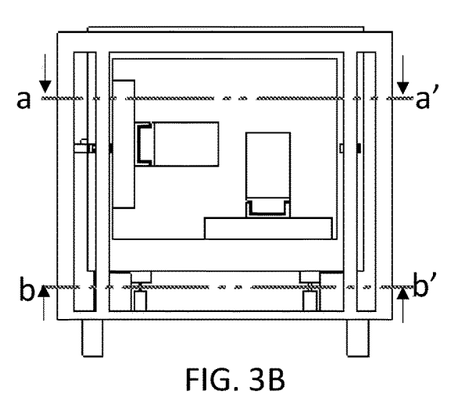
FIG. 3B is a side view of the apparatus shown in FIG. 3A.
Figure 3C:
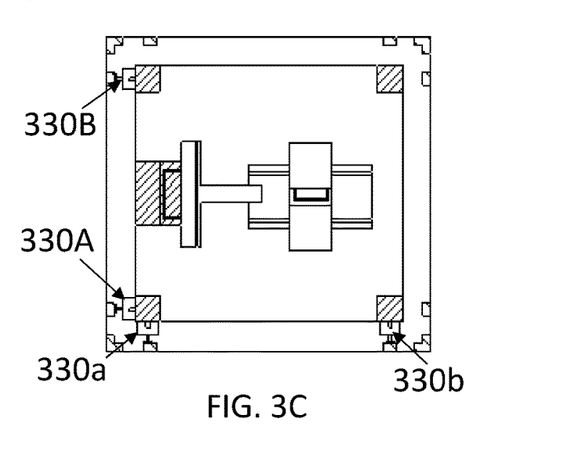
FIG. 3C is a cross-sectional view of the apparatus along line aa' shown in FIG. 3B.
Figure 3D:
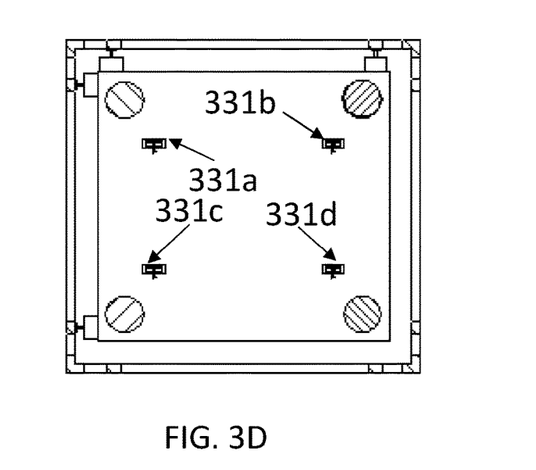
FIG. 3D is a cross-sectional view of the apparatus along line bb' shown in FIG. 3B.

Referring to FIG. 3D, similar to the fourth embodiment, the force compensation system in the fifth embodiment also includes four actuators 331a to 331d for compensating for a reaction force caused by any moveable structure which is driven to move along a linear motion direction parallel to the z-axis. Furthermore, as only two actuators are used for compensating for the reaction force(s) along the linear motion direction parallel to the x-axis or y-axis, a torque may be generated by the reaction force(s) and the first vibration suppression force(s) acted on the support structure 310. This torque can be canceled by the first vibration suppression forces applied on the support structure 310 by the four actuators 331a to 331d.

Although the sensing system is not shown in FIG. 3A to FIG. 3D, a sensing system similar to the one in the fourth embodiment may be installed in apparatus 300. The sensing system may include 8 sensors which are installed on the support structure 310 and each sensor is located adjacent to one of the 8 actuators of the force compensation system.

The apparatus provided in embodiments of the invention may be used in a semiconductor die bonding machine. The support structure may include a casting or granite operating surface of the die bonding machine on which at least two movable modules, for instance a bond head and a bond stage of the die bonding machine, are mounted. The die head may be driven to move along a linear motion direction parallel to the z-axis and the bond stage may be driven to move along a linear motion direction parallel to the x-axis or the y-axis. The die bonding machine may be used for thermal compression bonding (TCB), hybrid die bonding, wafer to wafer bonding, die to wafer bonding, or any other high precision bonding processes.

As will be appreciated from the above description, embodiments of the invention provide an apparatus and method for vibration attenuation. By using the apparatus and method, the vibration of a support structure in a machine caused by both acceleration of movable modules which are drivable to move on the support structure and vibration transferred from an external base of the machine to the support structure can be effectively canceled or at least attenuated by combining an active feedforward force compensation system and an active feedback damping system.

To enable the apparatus to compensate for reaction forces caused by a plurality of movable modules which are driven to move along different directions and located at different positions on the support structure, the force compensation system may be arranged to include at least two actuators, or more preferably four actuators, for compensating for reaction forces caused by the movable modules which are driven to move along linear directions that are orthogonal to one another. In other words, the apparatus provided in embodiments of the invention can be used for vibration suppression in 6 degrees of freedom. Furthermore, due to the arrangement of the actuators within the force compensation system, the said compensation for distinct reaction forces in various linear directions are decoupled or separated, thereby making the apparatus easy to tune to enhance its capability for attenuating vibrations of the support structure. In addition, the apparatus can also be used to counterbalance shifts in the center of gravity of the movable modules during the operation of the machine, thereby improving machine precision despite any tilting of the support structure.

In prior art solutions for attenuating vibration of the support structure, the number of actuators required will increase with the number of movable modules that are installed on the support structure and the number of directions along which the moveable modules are drivable to move. However, with the apparatus and method provided in the described embodiments of the invention, no additional actuators are required even if an increased number of movable modules are driven to move along various directions on the support structure. This will significantly reduce the complexity of the structure of the machine as well as the overall cost of manufacturing or testing devices mounted on the machine.

With the integration of an active feedforward force compensation system and an active feedback damping system, vibrations of the support structure in the machine are effectively reduced even if the support structure sits on resilient vibration isolators and even if relatively large reaction forces are generated by heavy movable modules. With a stable support structure, vibration coupling among a plurality of movable modules mounted on the support structure can be effectively reduced, and the accuracy of the machine, such as positioning accuracy of a die bonding machine, and the throughput of the machine will be significantly improved.

Although the present invention has been described in considerable detail with reference to certain embodiments, other embodiments are possible. Therefore, the spirit and scope of the appended claims should not be limited to the description of the embodiments contained herein.

The invention claimed is:

1. An apparatus for attenuating vibration of a support structure for supporting a movable module that is drivable to move on the support structure, the support structure being isolated from a base by a resilient vibration isolator, the apparatus comprising:
   a force compensation system coupled to the support structure for applying one or more first vibration suppression forces on the support structure for at least partially canceling a reaction force exerted by the movable module when the movable module is driven to move on the support structure, wherein the force compensation system includes at least two actuators configured and operative to compensate for the reaction force caused by acceleration of the movable module in each of first and second linear motion directions on the support structure, the first and second linear motion directions being perpendicular to each other, each actuator being operative to apply a first vibration suppression force parallel to the first or second linear motion direction on the support structure, and a sensing system attached to the support structure for measuring a vibration parameter of the support structure, wherein the force compensation system is further configured to apply at least one second vibration suppression force on the support structure according to the measured vibration parameter for attenuating vibration of the support structure.

2. The apparatus according to claim 1, wherein the force compensation system includes four actuators configured to apply a plurality of first vibration suppression forces parallel to the first or second linear motion direction of the movable module so as to balance the plurality of first vibration suppression forces acted on the support structure.

3. The apparatus according to claim 2, wherein a center of gravity of the movable module is located within a space formed between locations of the four actuators.

4. The apparatus according to claim 2, wherein the force compensation system includes a first set of four actuators configured and operative to compensate for a first reaction force caused by the movable module when the movable module is driven to move in the first motion direction, the first set of four actuators being operative to apply a plurality of first vibration suppression forces parallel to the first motion direction on the support structure for at least partially canceling the first reaction force.

5. The apparatus according to claim 4, wherein the force compensation system further includes a second set of four actuators configured and operative to compensate for a second reaction force caused by the movable module when the movable module is driven to move in the second motion direction, the second set of actuators being operative to apply a plurality of first vibration suppression forces parallel to the second motion direction for at least partially canceling the second reaction force so as to balance the plurality of first vibration suppression forces acted on the support structure.

6. The apparatus according to claim 5, wherein the force compensation system further includes a third set of four actuators configured and operative to compensate for a third reaction force caused by the movable module when the movable module is driven to move in a third motion direction, the third set of four actuators being operative to apply a plurality of first vibration suppression forces parallel to the third motion direction for at least partially canceling the third reaction force so as to balance the plurality of first vibration suppression forces acted on the support structure, the first, second and third motion directions being orthogonal to one another.

7. The apparatus according to claim 6, wherein the support structure has a cuboidal structure, the first set of four actuators being respectively located near four corners of a first side face or a second side face of opposing side surfaces of the support structure that are perpendicular to the first motion direction.

8. The apparatus according to claim 7, wherein the second set of four actuators are respectively located near four corners of a third side face or a fourth side face of opposing side surfaces of the support structure that are perpendicular to the second motion direction.

9. The apparatus according to claim 8, wherein the third set of four actuators are respectively located near four corners of a bottom face of the support structure.

10. The apparatus according to claim 1, wherein the force compensation system further includes a set of four actuators located at a bottom surface of the support structure, each actuator being configured and operative to apply a first vibration suppression force parallel to a third motion direction for at least partially canceling a reaction force caused by acceleration of the movable module in the third motion direction and balancing the plurality of first vibration suppression forces acted on the support structure, the first, second and third motion directions being orthogonal to one another.

11. The apparatus according to claim 1, wherein the apparatus comprises a processor configured for calculating the one or more first vibration suppression forces based on an acceleration and a position of a center of gravity of the movable module.

12. The apparatus according to claim 1, wherein the first vibration suppression force system is mounted on a frame arranged externally coupled to the support structure.

13. The apparatus according to claim 1, wherein the sensing system includes a plurality of sensors mounted on the support structure, and each sensor is located near an actuator of the force compensation system for measuring the vibration parameter of the support structure.

14. The apparatus according to claim 13, wherein the sensor includes a geophone or an accelerometer.

15. The apparatus according to claim 13, wherein the vibration parameter of the support structure comprises at least one of a velocity, an acceleration, and a displacement of the support structure.

16. A semiconductor bonding machine comprising an apparatus for attenuating vibration of a support structure in the semiconductor bonding machine that supports a bond head and a bond stage that are drivable to move on the support structure, the support structure being isolated from a base by a resilient vibration isolator, the apparatus comprising:

a force compensation system coupled to the support structure for applying one or more first vibration suppression forces on the support structure for at least partially canceling a reaction force exerted by each of the bond head and the bond stage when they are driven to move on the support structure during a semiconductor bonding process, and a sensing system attached to the support structure for measuring a vibration parameter of the support structure, wherein the force compensation system is further configured to apply at least one second vibration suppression force on the support structure according to the measured vibration parameter for attenuating vibration of the support structure.

17. A method for attenuating vibration of a support structure that supports a movable module that is drivable to move thereon, the method comprising:

activating a force compensation system to apply one or more first vibration suppression forces on the support structure for at least partially canceling a reaction force exerted by the movable module when it is driven to move on the support structure, wherein the force compensation system includes at least two actuators configured and operative to compensate for the reaction force caused by acceleration of the movable module in each of first and second linear motion directions on the support structure, the first and second linear motion directions being perpendicular to each other, each actuator being operative to apply a first vibration suppression force parallel to the first or second linear motion direction on the support structure, and applying at least one second vibration suppression force on the support structure with the force compensation system according to a vibration parameter of the support structure measured with a sensing system for attenuating vibration of the support structure.

\* \* \* \* \*